United States Patent [19]

Ueda et al.

[11] 4,321,519

[45] Mar. 23, 1982

[54] MAGNETIC FIELD DETECTION DEVICE FOR ELECTRONIC TIMEPIECE

[75] Inventors: Makoto Ueda; Akira Torisawa; Shuji Otawa; Masaaki Mandai; Masaharu Shida; Katsuhiko Sato, all of Tokyo, Japan

[73] Assignee: Kabushiki Kaisha Daini Seikosha, Tokyo, Japan

[21] Appl. No.: 33,230

[22] Filed: Apr. 25, 1979

[30] Foreign Application Priority Data

May 26, 1978 [JP] Japan .................................. 53-62996

[51] Int. Cl.³ ............................................. G05B 19/40
[52] U.S. Cl. .................................. 318/696; 318/647; 368/10; 368/11
[58] Field of Search ............... 318/647, 696; 58/23 R, 58/23 D, 28 R, 28 A, 28 B, 28 D; 368/10, 11

[56] References Cited

U.S. PATENT DOCUMENTS 3,756,010  9/1973  Kimura et al. ..................... 58/23 D
4,158,287  6/1979  Nakajima et al. .................. 58/23 D

*Primary Examiner*—J. V. Truhe
*Assistant Examiner*—Eugene S. Indyk
*Attorney, Agent, or Firm*—Robert E. Burns; Emmanuel J. Lobato; Bruce L. Adams

[57] ABSTRACT

An electronic timepiece of the type having a frequency dividing circuit, and a drive circuit for driving a motor having a rotor, a stator and a driving coil, is provided with a magnetic field detection device comprised of a low impedance closed loop including a low resistance element and the driving coil and a high impedance closed loop including a high resistance element and the driving coil. The driving coil develops an induced voltage when placed in an external alternating magnetic field and also functions to drive the rotor. The strength of the alternating magnetic field is measured by the voltage level developed across the high resistance element and the measuring sensitivity is improved by alternately switching between the low impedance closed loop and the high impedance closed loop. In response to the detection output of the magnetic field detection device, the effective power applied to the driving coil is increased so that the motor performance is not adversely affected by the external alternating magnetic field.

8 Claims, 11 Drawing Figures

MAGNETIC FIELD DETECTION DEVICE FOR ELECTRONIC TIMEPIECE

BACKGROUND OF THE INVENTION

The present invention relates to a motor which detects an AC magnetic field without using particular detection elements.

FIELD OF THE INVENTION

When an external magnetic field is applied to a motor, a drive coil of the motor serves as a kind of a transformer and induces a voltage across the coil, and thereby rotation of the motor is adversely affected by the magnetic field. This phenomenon is highly disadvantages for motors and electronic timepieces using motors. Therefore, in order to design motors and electronic timpieces resistant to the adverse influences of external magnetic fields, according to the present invention the external magnetic field is detected to generate an alarm sound or change the drive condition of the motor according to the area of the external magnetic field.

DESCRIPTION OF THE PRIOR ART

In the conventional motors and electronic timepieces using motors, the external AC magnetic field has been detected by employing particular elements to detect the external magnetic field, such as magnetic resistant elements, Hall effect elements, lead switches and the like in the motors and the electronic timepieces using motors. These other detection elements were necessary to detect the magnetic field and, therefore, the electronic wristwatches using such motors required space to accommodate the detection elements and as a consequence could not be reduced in size and thickness. Moreover, the power consumption by the detection elements shortened the battery life of the electronic wristwatches and the inclusion of the detection elements increases the cost of the electronic wristwatch.

SUMMARY OF THE INVENTION

Accordingly, it is an object of the present invention to provide a motor which is resistant to external AC magnetic fields and which does not suffer the above-mentioned disadvantages.

It is another object of the present invention to detect an AC magnetic field on the order of 1 oersted without using an amplifier element.

It is still another object of the present invention to provide an AC magnetic field detection device for amplifying the voltage induced in the coil by an external magnetic field without using a discrete amplifier element by alternately connecting a low impedance element, such as a low resistance, to both ends of the coil of the motor and connecting a high impedance element, such as a high resistance.

It is a further object of the present invention to provide a motor an an electronic timepiece which is able to detect the existence of a magnetic field.

DESCRIPTION OF THE PREFERRED EMBODIMENTS

Before illustrating the principle of the AC magnetic field detection method, the basic construction of the motor with which the detection principle of the present invention can be most suitably applied will be illustrated.

Figure 1:
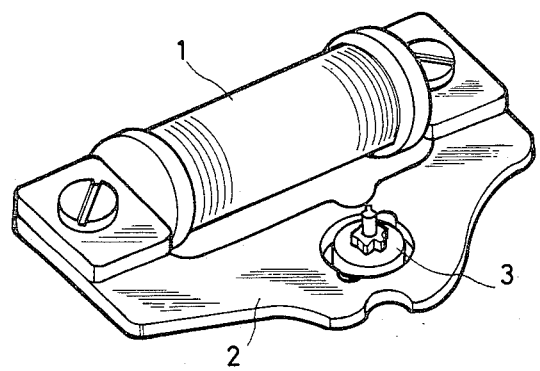
FIG. 1 is a perspective view of a motor for a timepiece.
Figure 2:
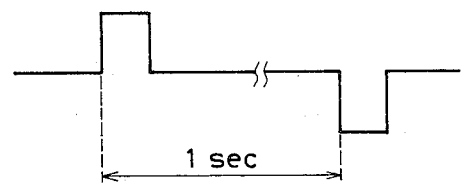
FIG. 2 is a timing chart of the alternating drive pulse.

As shown in FIG. 1, a coil 1 wound on a magnetic core consists of a high magnetic permeability member, a stator 2 consists of a high magnetic permeability member and a rotor 3 consists of a permanent magnet member magnetized on two poles in the diametrical direction. As shown in FIG. 2, pulses which alternately change the direction of current applied to the coil are applied to the motor and thereby the rotor 3 rotates in one direction.

One feature of the present invention is to use the coil 1 of the motor as a detection element of the AC magnetic field thereby dispensing with the need of having to use separate magnetic field detection elements. Reference will now be given of the voltage induced in the coil 1 when the motor is exposed to an AC magnetic field.

Figure 3:
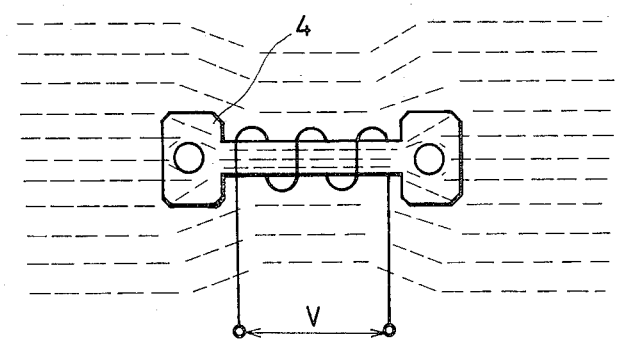
FIG. 3 shows a magnetic flux state when the coil is in a magnetic field.

FIG. 3 is an explanatory view showing a coil of a motor wound on the magnetic core 4. Since the core used for the motor is thin in general (i.e., small in cross-sectional area and long in length), the external magnetic field concentrates on the magnetic core 4 of the coil, and the magnetic flux density in the magnetic core is generally ten times as much as the external magnetic flux density. The voltage V induced in the coil 1 at this time will be given by $V = -n \cdot d\Phi/dt$ ... (1) when the number of turns of the coil 1 is n and the magnetic flux of the magnetic core 4 is $\Phi$.

TABLE 1

| Magnetic core material | 45 permalloy |
|---|---|
| Length of magnetic core | 12mm |

TABLE 1-continued

| | |
|---|---|
| Sectional area of magnetic core | 0.8mm × 0.8mm |
| Number of turns of coil | 10000 turns |

Assuming that the magnetic flux density of the magnetic core of the shape explained in TABLE 1 is 10 times as much as the external magnetic flux density, the magnetic flux $\Phi$ of the magnetic core 4 can be given by the following equation: $\Phi = 10 \times S \times B \times \sin \omega t \ldots$ (2), where S is the sectional area of the magnetic core 4, and B (Gauss) is the peak value of the magnetic flux density in the AC magnetic field. By combining equations (1) and (2), $$V = -10 \times n \times S \times B \times \omega \times \cos\omega t$$
$$= -10 \times 1 \times 10^4 \text{ (turns)} \times 0.64 \times 10^{-4}(m^2) \times B \times 10^{-4}(wb/m^2) \times 2\pi \times 50(Hz) \times \cos\omega t$$
$$= -6.4\pi \times 10^{-2} \times B \times \cos\omega t$$
$$= -0.20 \times B\cos\omega t$$

Accordingly, if the magnetic flux density of the external magnetic field B is 2 Gauss, $V = -0.4 \cos \omega t [V]$. If the motor is incorporated in instruments of limited energy source and limited space, 00; such as an electronic wristwatch, the detection circuit must be operated with the detection voltage around 0.4[V]. Therefore it is necessary to amplify the detection voltage to control C-MOS circuitry of low power dissipation serving as the detecting device. However, it is very difficult to make a C-MOS amplifier which operates stably with low power consumption.

The principle of amplification is described in detail in conjunction with FIG. 4 and the circuit construction and operation will be illustrated later.

Figure 4:
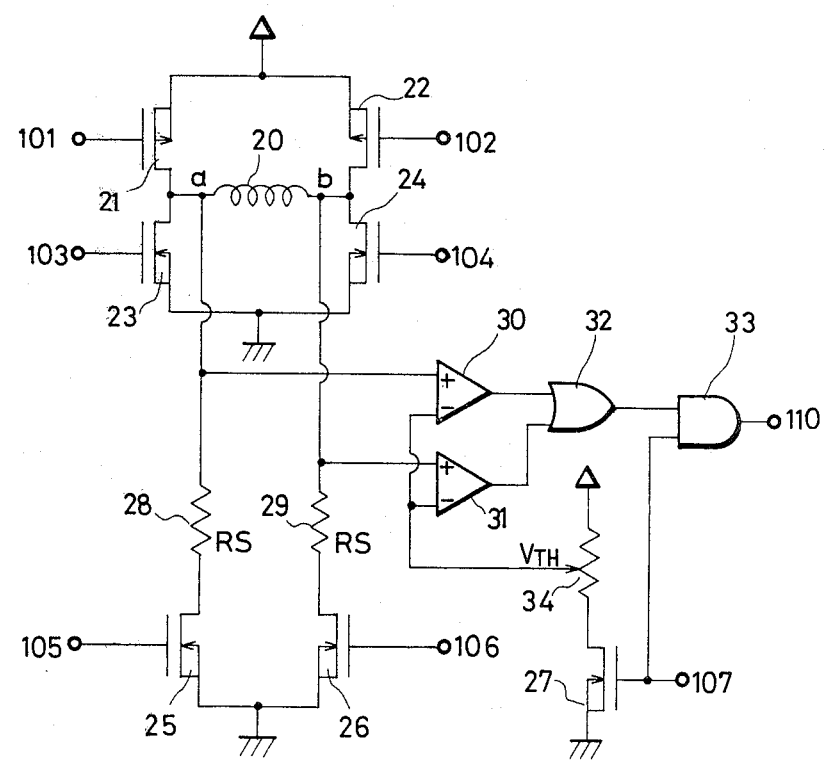
FIG. 4 shows a drive and detection circuit according to the present invention.

In FIG. 4, a drive circuit and amplifying means are composed of P type MOS FET gates (referred to as P gates hereafter) 21 and 22, N type MOS FET gates (referred to as N gates hereafter) 23, 24, 25 and 26, detection resistors 28, 29 and the motor 20.

A method to amplify the detection signal is to switch alternately a low impedance closed loop composed of the motor 20 and the N gates 23 and 24 and a high impedance closed loop composed of the motor 20, the N gates 23, 26 and the detection resistor 29 while the motor is not driven. The closed loop composed of the motor 20 and the N gates 23 and 24 shows a short circuit across the coil. The N gates 23 and 24 are transistors for driving the motor, the ON resistance thereof is generally around several tens $\Omega$ and since the voltage developed across the coil shows a short circuit by the ON resistance, a comparatively large current flows in the N gates 23 and 24.

Subsequently, when the high impedance closed loop composed of the motor 20, the N gates 23, 26 and the detection resistor 29 is made by switching ON the N gates 23 and 26, the inductance of the coil in the motor acts on to continue to flow the comparatively large current flown before the high impedance closed loop is formed by switching ON the N gates 23 and 26, and a large voltage momentarily develops across the detection resistor 29 for an instant. And thereafter the voltage decreases stable state determined by the detection resistor 29, the induced voltage by the external magnetic field, the coil resistance and the like.

Initially, the coil which produces the induced voltage is incorporated in the low impedance closed loop. And next, the coil is incorporated in the high impedance closed loop including the detection resistor 29. The large current flows in the low impedance closed loop because the low impedance includes a short circuit. The high voltage across the detection resistor 29 is developed because the inductance of the coil has the characteristic that it functions to maintain the previous state of the current.

Referring to the multiplying factor in the case the voltage induced by the external magnetic field is amplified by alternately switching the high and low impedance closed loops.

Figure 5A:
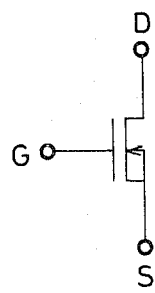
FIG. 5(A) is a symbol diagram showing an N channel FET gate.
Figure 5B:
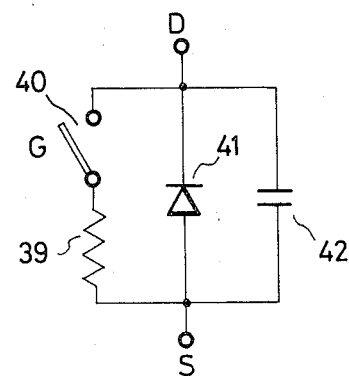
FIG. 5(B) is an equivalent circuit diagram showing an N channel FET gate.

FIG. 5A shows an N gate and FIG. 5B is the equivalent circuit thereof. A switch 40 is turned ON and OFF by the gate signal. The circuit comprises an ON resistance 39 in case the motor drives, a PN junction diode 41 between the substrates and the drain D, numeral 42 a summation condensor 42 of the PN junction capacity between the substrate and the drain, the capacity between the drain and the gate, the pad capacity, the stray capacity and the like.

Figure 6:
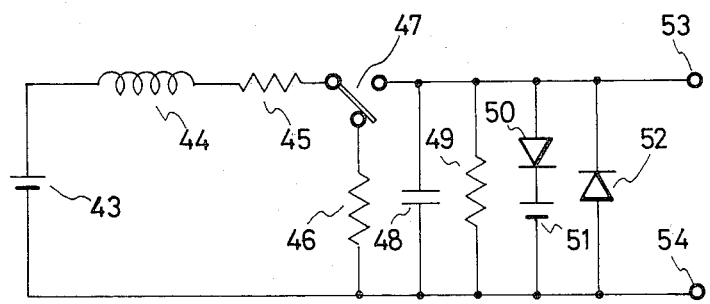
FIG. 6 is an equivalent circuit of a detection circuit according to the present invention.

If the P gate and the N gate in FIG. 4 are replaced according to the equivalent circuit in FIG. 5 and the battery is replaced by a condenser of large capacity which thus functions as an ideal power source, the equivalent circuit of the detection method will be as shown in FIG. 6.

The equivalent circuit in FIG. 6 comprises a voltage $V_o$ denoted by numeral 43 developed by the external magnetic field, a coil 44 having an inductance of L henry, an internal resistance 45 of the coil $r\Omega$, a loop change-over switch 47, and an ON resistance 46 of the N gate $rN\Omega$, provided that $rN\Omega$ is neglected since the value thereof is sufficiently smaller than that of the coil resistance. A condenser 48 represents the parasitic capacity on the N gate and P gate, which is a summation of the parasitic capacities on the N gate 24 and the P gate 22, in C farads. A detection resistor 49 has a resistance $Rs\Omega$, parasitic diodes 50 and 52 are connected between the substrate and the drain of the N gate and the P gate, and a battery 51, which is a silver battery generally incorporated in a timepiece, $V_D = 1.57$ V, is provided as the power source.

The output voltage of the terminal 53 serves as a detection voltage $V_{RS}$ and is fed to the voltage detection element.

Responses in case the change-over switch 47 is changed over according to the equivalent circuit in FIG. 6 are theoretically obtained below.

When $$a = \frac{1}{2}\left(\frac{r}{L} + \frac{1}{CRs}\right), b = \frac{L + Rs}{LCRs}$$

$$E = \frac{Rs}{Rs + r} V_0, \omega = \sqrt{a^2 - b}, D = 1 - e^{-\frac{R}{L}t_0}$$

(i) In case $a^2 > b$ $$V_{RS} = E\left[1 - \left\{\frac{1}{\omega}\left(a - \frac{DL}{r}b\right)\sinh\omega t + \cosh\omega t\right\}e^{-at}\right]$$

(ii) In case $a^2 = b$ $$V_{RS} = E\left\{1 - \left(1 + at - \frac{DL}{r}bK\right)e^{-at}\right\}$$

(iii) In case $a^2 < b$ $$V_{RS} = E\left[1 - \left(\frac{1}{\omega}\left(a - \frac{DL}{r}b\right)\sin\omega t + \cos\omega t\right)e^{-at}\right]$$

wherein $t_0$ is the connection period of the closed loop composed of the low resistance and t is the time.

Figure 7A:
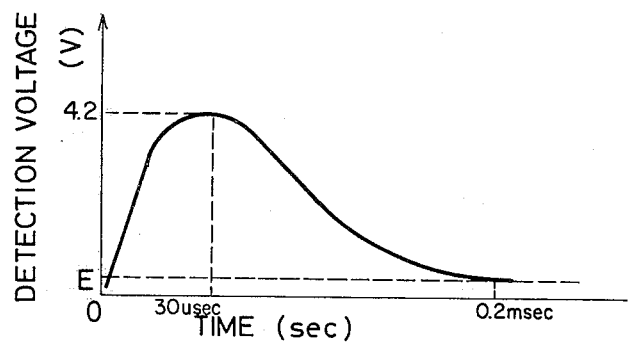
FIG. 7(A) is an enlarged detection voltage waveform according to the present invention.

The $V_{RS}$ waveform of the above equation is shown in FIG. 7(A).

If $V_{RS}$ is calculated according to an embodiment under the condition that L=11 henry, C=75PF, Rs=150 KΩ, r=2.8 KΩ, $V_0$=0.1 V and $t_0=\infty$, for convenience of calculation, it takes about 30 μsec to get to the peak voltage of $V_{RS}$ and the peak voltage at this time is 4.2 V and the multiplying factor thereof is 42 times, which clearly shows that the detection signal is easily amplified without using the analogue signal amplifier.

The above theoretical value is given assuming that the voltage developed across the coil is constant. Actually, however, in the case of the high impedance closed loop of high resistance, the time constant is small and it takes a comparatively short time to recover to the stationary voltage, on the other hand, in the case of the low impedance closed loop of low resistance, the time constant is large and it takes long to recover to the stationary voltage.

More specifically, in the case of the high impedance closed loop of high resistance, it takes about 0.2 msec for $V_{RS}$ to recover to the stationary voltage, while in the case of the low impedance closed loop of low resistance, the time constant thereof is given by $\tau = L/r = 3.9$ msec, which indicates that the peak voltage of $V_{RS}$ is no more than 63% of the stationary voltage even if the low impedance closed loop of low resistance maintains for 3.9 msec.

Generally, since the frequencies of the AC magnetic field most frequently encountered are the commercial frequencies of 50 HZ or 60 Hz having respective periods of 20 msec or 16.7 msec, the pulse width of 3.9 msec is too long to detect the maximum strength of the magnetic field.

Figure 7B:
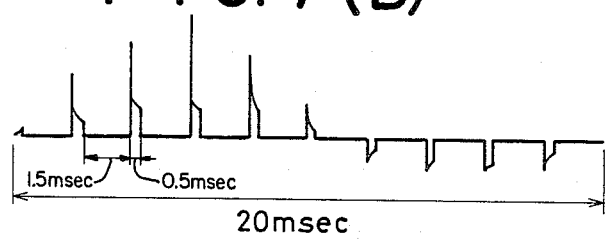
FIG. 7(B) is a detection voltage waveform.

FIG. 7(B) is a detection voltage waveform chart according to the present invention, in which the high impedance closed loop of high resistance is switched on for 0.5 msec and the low impedance closed loop of low resistance is switched on for 1.5 msec in the case in which the AC magnetic field is 50 Hz under the above mentioned condition. The multiplying factor of the detection signal here is about 15 times. The voltage produced across the motor coil is represented by line 57 in FIG. 7(C). FIG. 7(A) shows an enlarged detection voltage waveform corresponding to one of the detection pulses shown in FIG. 7(B).

Figure 7C:
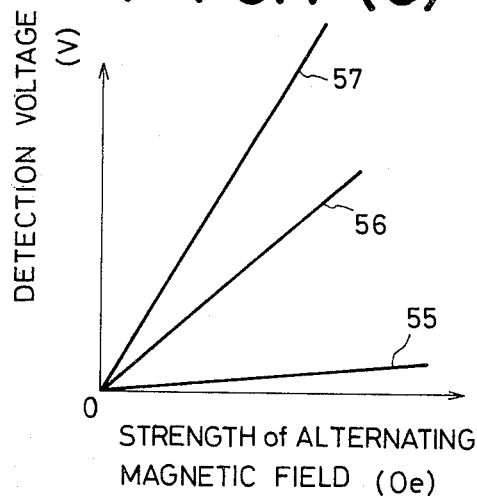
FIG. 7(C) shows a relation between the strength of the AC magnetic field and the detection voltage.

FIG. 7(c) shows the relation between the strength of the AC magnetic field and the detection voltage, under different conditions. The line 55 represents the voltage developed across the coil with the two ends of the coil open, the line 56 represents the voltage developed across the coil when the low impedance closed loop represents the low resistance and the high impedance closed loop of high resistance are alternately switched on every 0.5 msec, and the multiplying factor is about 5 times.

Thus, in case the AC magnetic field is detected, since one cycle of 50 Hz commercial frequency is 20 msec, it is necessary to shorten the time to alternately switch the high impedance closed loop of high resistance and the low impedance closed loop of low resistance. However, in case the multiplying factor of the detection voltage within the cycle of 20 msec is increased, it is to be noted that the period to switch the low impedance closed loop of low resistance is longer than the period to switch the high impedance closed loop of high resistance.

As illustrated so far, since the detection signal can be amplified only by switching the gate composite elements, the AC magnetic field can be detected by a comparator which is easily fabricated in the C-MOS IC of the timepiece and which compares high or low voltage to the reference voltage. Moreover, since the multiplying factor of the detection signal according to the present invention is more than 10 times, the voltage can be compared to the reference voltage within the threshold voltage of the C-MOS IC inverter.

According to the present embodiment, the resistance property on parameter is used as an impedance element for performing the detection; however, similar detection is possible by using the capacitance property and the inductance property. While according to the present embodiment, since all the detection elements are incorporated in the C-MOSIC, the feature of the non-saturation portion of a buffer transistor, an active element, is taken advantage of as a low resistance element. Thus, although the present embodiment is illustrated using a passive impedance element, it is to be noted that it causes no inconveniences to use the active elements.

As for the actual construction of the AC magnetic field detection device, the low impedance closed loop of low resistance is composed of the ON resistance of the high buffer transistor, the closed loop of high resistance is composed of the diffusion resistance inside and the IC, the voltage detection element is composed of a C-MOS inverter or comparator.

According to the present invention, it causes no trouble that the high impedance closed loop of high resistance is of the maximum value, namely of the open loop or open circuit. Even in the case of the open loop, the parasitic capacity exists in the buffer transistor and thereby the peak voltage is not amplifier unlimitedly by the capacity component and detection similar to that of the closed loop of high resistance is possible. In case the high resistance is unlimitedly increased, it is advantageous that the circuit construction is simplified.

An illustration will now be given of the manner by which the electronic timepiece is prevented from stopping even in case the timepiece is placed within an AC magnetic field by applying the magnetic field detection device according to the present invention.

Figure 8:
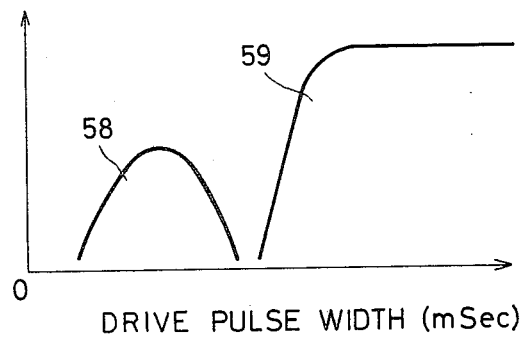
FIG. 8 is a characteristic diagram showing the relation between the drive pulse width and the AC magnetic resistance.

FIG. 8 is a characteristic diagram showing the drive pulse width of the motor and the AC magnetic resistance. Normally the motor is driven inside the range indicated by curve 58 for efficiency. As the pulse width widens or increases inside the range 58, the rotational position of the rotor and the off-timing of the drive pulse interfere with each other and consequently the rotation of the rotor begins to misoperate and thereby the AC magnetic resistance becomes worse. When the drive pulse width is increased or widened more, the motor comes to be driven inside the range indicated by curve 59 in FIG. 8. In the range 59, the drive pulse timing is off after the rotor is sufficiently driven by the magnetic flux of the coil, and thereby the motor is in the most resistant state aganst the influences caused by the external magnetic field. Namely, when the timepiece is detected to be subjected to the influence of an AC magnetic field, the compulsory drive pulse of the motor can be set to the pulse width having the best AC magnetic resistance within the range 58 or to a sufficiently wide pulse width within the range 59 by the method according to the present invention.

In the conventional motor without the magnetic field detection circuit, the magnetic resistance is increased by adding parts such as the magnetic sealed plate, magnetic sealed ring and the like at the sacrifice of the magnetic resistance when the drive pulse is set so that the motor may operate most efficiently. On the other hand, in the method according to the present invention, the motor is driven with the most efficient pulse width and with excellent magnetic resistance.

Referring now to the embodiment of the AC magnetic field detection circuit shown in FIG. 4, the P gates 21, 22 and the N gates 23 and 24 compose two couples of C-MOS inverters and each of the output terminals a and b are connected to respective ends of the coil 20 of the stepping motor and are also connected to one of the ends of the detection resistors 28 and 29. The other ends of the detection resistors 28 and 29 are connected to the source inputs of the N gates 25 and 26. Positive input terminals of voltage comparators 30 and 31 are connected to the one ends of the detection resistors 28 and 29, negative input terminals of the voltage comparators 30 and 31 are connected to a voltage dividing point of a reference voltage resistors 34, and both output terminals of the comparators 30 and 31 are connected to an OR gate 32. One end of the reference voltage resistor 34 is grounded via an N gate 27. Two input terminals of an AND gate 33 are connected respectively to an output of the OR gate 32 and a gate terminal of the N gate 27. Gate terminals 101, 102, 103, 104, 105, 106 and 107 of the P and N gates 21, 22, 23, 24, 25, 26 and 27 and an output terminal 110 of the AND gate 33 are connected to a control circuit 65.

Figure 9:
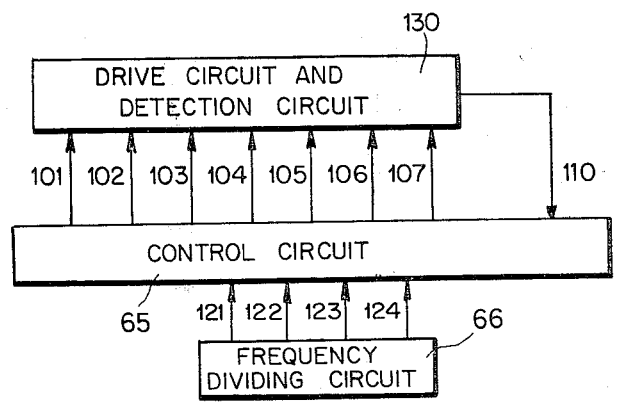
FIG. 9 is a circuit block diagram of an electronic timepiece according to thepresent invention.
Figure 10:
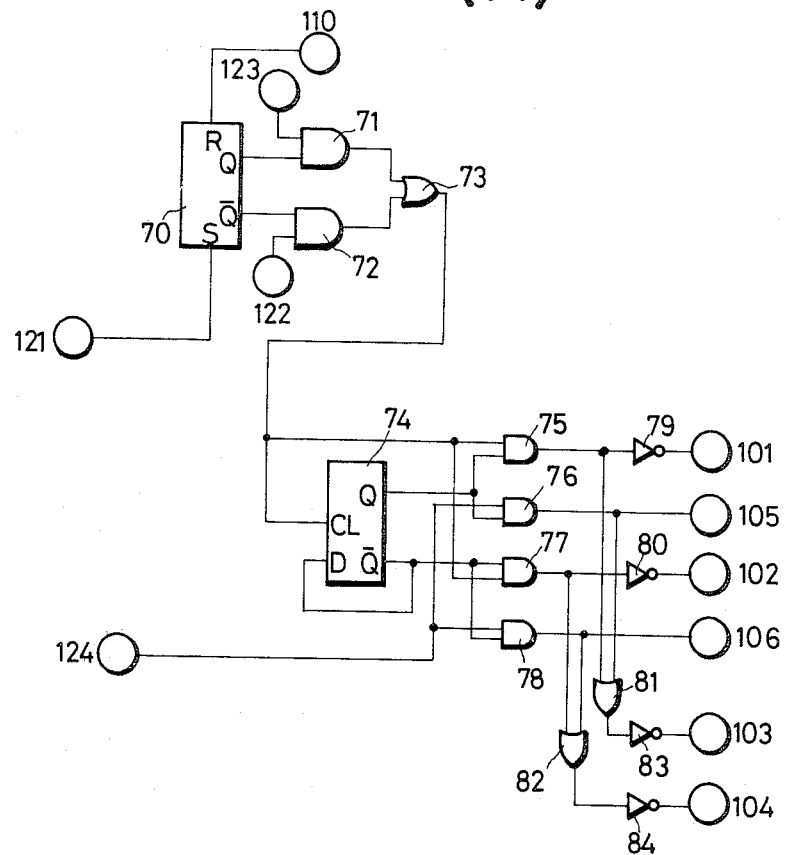
FIG. 10(A) shows an embodiment of a control circuit according to the present invention.
FIG. 10(B) shows an embodiment of the input signals applied to the control circuit according to the present invention.
Figure 10:
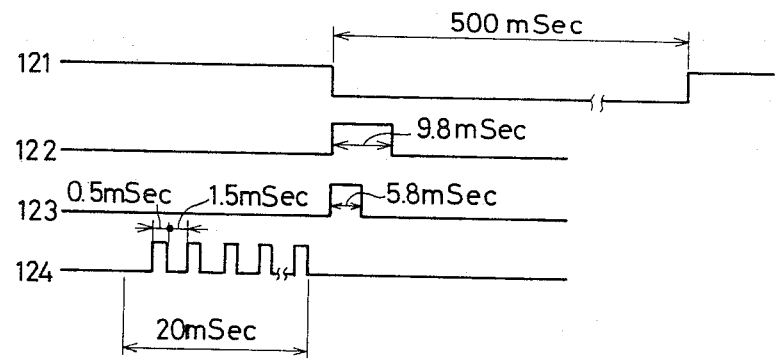

As shown in a circuit block diagram in FIG. 9, the control circuit 65 suitably composes the frequency divided signals produced from an a frequency dividing circuit 66 fed by a quartz crystal oscillator or the like (not shown) and produces the signals necessary for operating the drive circuit and the detection circuit 130. An embodiment of the control circuit is shown in FIGS. 10 (A) and 10 (B). FIG. 10 (A) is a circuit diagram of the control circuit and FIG. 10 (B) is a timing chart of the various input signals. These input signals, in a cycle of one second, can be easily composed by the output of the frequency dividing circuit so that the circuit diagram thereof has been omitted.

A reset input R of an RS flipflop (referred to as FF hereafter) 70 is connected to the input terminal 110, a set input S thereof is connected to receive a signal 121, outputs Q, Q̄ thereof are connected to input terminals of AND gates 71 and 72, the other input terminals of the AND gates 71, 72 are connected to receive signals 122, 123 and the output terminals of the AND gates 71, 72 are connected to input terminals of an OR gate 73.

A clock input CL of a DFF 74 is connected to an output terminal of the OR gate 73, the positive output Q thereof is connected to input terminals of AND gates 75, 76, and the negative output Q̄ thereof is connected to input terminals of AND gates 77, 78 and to a data input terminal D of the DFF 74. The other input terminals of the AND gates 75, 77 are connected to an output of the OR gate 73 and the other input terminals of the AND gates 76, 78 are connected to receive a signal 124. An output from the AND gate 75 is connected to the gate terminal 101 via an inverter 79, an output from the AND gate 76 is connected to the gate terminal 105, an output from the AND gate 77 is connected to the gate terminal 102 via an inverter 80, and an output from the AND gate 78 is connected to the gate terminal 106. Input terminals of OR gates 81 and 82 are connected to the outputs of the AND gates 75, 76, 77, 78 and the outputs thereof are connected to the gate terminals 103, 104.

Hereafter the operation of the present embodiment will be described in detail in conjunction with the timing charts in the FIGS. 11(A) and 11(B), FIG. 4, FIGS. 10(A) and 10(B).

In FIG. 10(A), since a set input is fed to the RSFF 70 each second by the signal 121, the output Q="H", Q̄="L" until the detection signal is produced from the output terminal 110 as will be described later. Accordingly the signal 123 is produced from the OR gate 73. The outputs from the DFF 74 are inverted each time a pulse is fed to the clock input CL. As a result, the pairs of gate terminals 101 and 102, 103 and 104, 105 and 106 produce waveforms which alternate with one another each second.

Figure 11A:
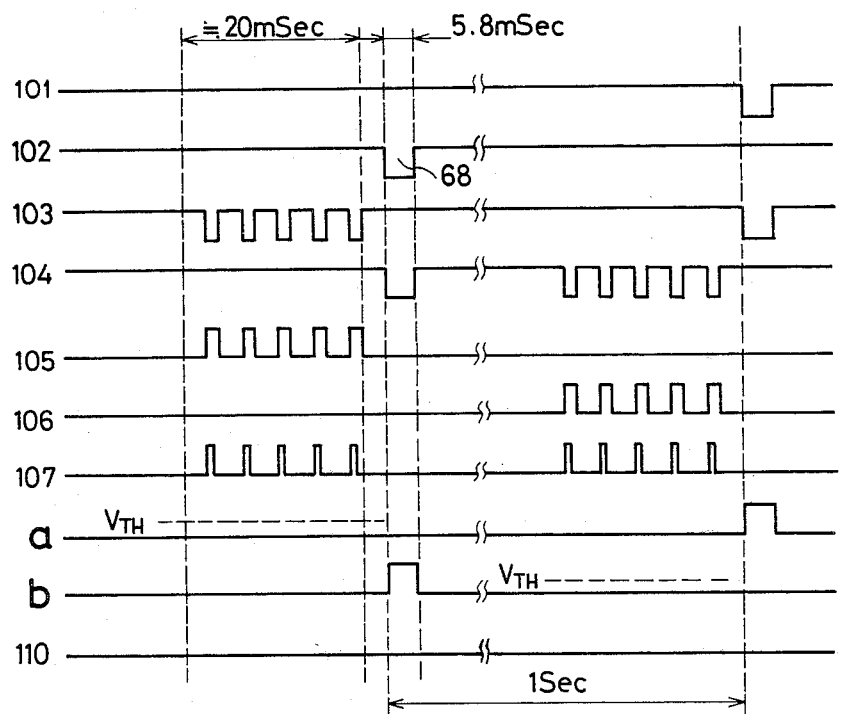
FIG. 11(A) is a timing chart of the output signals from the control circuit according to the present invention.

The waveforms which alternately replace one another each second are represented by 101, 102, 103, 104, 105, and 106 in FIG. 11(A). The signal 123 is the normal drive pulse signal of the stepping motor under normal condition, and the pulse width thereof is determined by such factors as the load, the size of the stepping motor and the like. The pulse width of the drive pulse of the stepping motor according to the present embodiment is 5.8 msec. The signal 122 is a compulsory drive pulse signal produced in place of the normal drive pulse when the stepping motor is subjected to a magnetic field with the aid of the AC magnetic field detection circuit according to the present invention. The pulse width of the compulsory drive pulse is longer than that of the normal pulse width in general and according to the present embodiment is 9.8 msec. The signal 124 is a detection pulse signal to detect the AC magnetic field according to the present invention. The frequencies often encountered in our daily life are the commercial frequencies of 50 HZ and 60 HZ. Therefore the whole detection section is at least a single wavelength 20 msec of 50 HZ commercial frequency as this has the longer wavelength than that of the 60 HZ commercial frequency. On the other hand, the change-over duty cycle of the high impedance loop of high resistance and the low impedance loop of low resistance is 1:3 (though this is exaggerated in the drawing) and the frequency is 512 HZ in the present embodiment.

In FIG. 11(A), the signal 107 serves to decrease the current consumed by the reference voltage resistor 34 in the detection circuit as much as possible and to mask the detection signal so that the detection signal is not produced in case it is not needed. The frequency of the signal 107 is the same as that of the detection pulse 124 and the duty cycle of the high impedance closed loop of high resistance and the low impedance closed loop of low resistance, which would be expected to be smaller than that of the signal 124, is 1:7 in the present embodiment.

Before the time that the AC magnetic field is detected during the detection station 20 msec in FIG. 11(A), P gates 21, 22 are OFF, N gates 25, 26 and 27 are OFF, N gates 23, 24 are ON, both ends of the coil 20 are grounded, the AND gate 33 is masked and the detection signal 110 is "L" in FIG. 4. At the time the detection pulse 105 is "H", N gates 24, 25 and 27 are ON and the high impedance closed loop of high resistance is made while at the low impedance time the detection pulse is "L", N gates 23, 24 are ON and the closed loop of low resistance is made, and thereby the closed loops including the coil 20 heretofore described during the discussion of the principle of amplification can be alternately changed over. When the motor is not subjected to the AC magnetic field, both ends a, b of the coil are constantly at 0-volts and do not reach the detection threshold voltage level Vth and the detection signal 110 maintains "L". Accordingly a normal drive pulse 68 of 5.8 msec is applied during the next drive period. At this time only the P gate 22 and the N gate 23 are ON and current flows through the coil 20 from b to a. At the next drive period about a second later, the phase changes and a similar operation is carried out with the circuit.

Figure 11B:
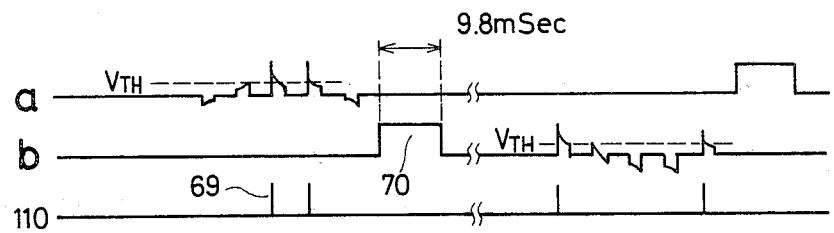
FIG. 11(B) is a timing chart in the condition in which the AC magnetic field is detected according to the present invention.

Referring now to the case where the motor is subjected to the AC magnetic field in conjunction with FIG. 11(B), at the detection time, the signal shown in FIG. 11(B) is present at both ends a and b of the coil as described in the discussion of amplification. The signal is fed to the voltage comparators 30 and 31 so as to be compared to the detection threshold voltage level Vth and thereby a detection signal 69 is produced. The detection signal 69 is fed to the reset terminal of the RSFF 70 in FIG. 10(A) and inverts the circuit conditions. As a result, the compulsory drive pulse 122 is applied to the motor right away after the drive period and the motor is stably driven even when subjected to the AC magnetic field.

Taking advantage of the output from the AC magnetic field detection device according to the present invention, the motor drive pulse width, the motor drive voltage and an alarm buzzer drive circuit for providing an audible alarm signifying the existance of the AC magnetic field are easily controlled. The AC magnetic field detection device according to the present invention is most suitable for electronic wristwatches, in which without using elements other than the conventional composite elements for wristwatches, a highly sensitive AC magnetic field detection device can be provided. Moreover, the power source for detecting the induced voltage is not necessary to detect the voltage induced in the coil of the motor and further, the detection circuit scarcely consumes the power source. Accordingly, the electronic wristwatch provided with the AC magnetic field detection device can be manufactured without increasing the power consumption, space and cost in comparison with the conventional wristwatches and the technological effect is great.

It is to be noted that though the motor of the type shown in FIG. 1 is employed in the disclosed embodiment according to the present invention, the present invention can be applied to the motor of the type having the coil which induces the voltage by the external magnetic field.

We claim:

1. In an electronic timepiece of the type having a frequency dividing circuit; and a drive circuit for normally applying effective power for driving a motor having a rotor, a stator and a driving coil, the improvement comprising: detecting means operable to detect an external alternating magnetic field including a coil for developing therein an induced voltage when said coil is placed in an external alternating magnetic field and for producing a detection output signal in response to detection of an alternating magnetic field strength higher than a predetermined magnetic field strength; and control circuit means for effecting the application of an effective power to said driving coil different from the effective power normally applied to said driving coil in response to the detection output signal.

2. An electronic timepiece as claimed in claim 1; wherein said coil for detecting the external alternating magnetic field comprises said driving coil for driving the motor.

3. An electronic timepiece as claimed in claim 1; including means for effecting operation of said detecting means during the non-driving time of the motor.

4. An electronic timepiece as claimed in claim 2; wherein said detecting means comprises a low impedance loop having a low resistance element and said driving coil, and a high impedance loop having a high resistance element and said driving coil.

5. An electronic timepiece as claimed in claim 4; including means for alternately switching between said low impedance loop and said high impedance loop in response to a signal from said frequency dividing circuit.

6. An electronic timepiece as claimed in claim 4; wherein the detection time of said detecting means is greater than at least 20 msec.

7. In a stepping motor driven by a drive circuit, said stepping motor having a rotor, a stator and a driving coil, and a pulse generating means for controlling said drive circuit, the improvement comprising: detecting means for detecting an external alternating magnetic field including a low impedance loop having a low resistance element and said driving coil, and a high impedance loop having a high resistance element and said driving coil, and for producing a detection output signal in response to detection of an alternating magnetic field strength higher than a predetermined magnetic field strength; and control circuit means connected between said drive circuit and said pulse generating means for effecting the application of an effective power to said driving coil different from the effective power normally applied to said driving coil in response to the detection output signal.

8. A stepping motor as claimed in claim 7; including means for alternately switching between said low impedance loop and said high impedance loop in response to a signal from said pulse generating means.

* * * * *